(12) United States Patent
Memering et al.

(10) Patent No.: US 9,416,442 B2
(45) Date of Patent: Aug. 16, 2016

(54) SAPPHIRE PROPERTY MODIFICATION THROUGH ION IMPLANTATION

(71) Applicant: Apple Inc., Cupertino, CA (US)

(72) Inventors: Dale N. Memering, San Francisco, CA (US); Christopher D. Prest, San Francisco, CA (US); Douglas Weber, Arcadia, CA (US)

(73) Assignee: APPLE INC., Cupertino, CA (US)

( * ) Notice: Subject to any disclaimer, the term of this patent is extended or adjusted under 35 U.S.C. 154(b) by 79 days.

(21) Appl. No.: 13/783,264

(22) Filed: Mar. 2, 2013

(65) Prior Publication Data
US 2014/0248472 A1    Sep. 4, 2014

(51) Int. Cl.
| | |
|---|---|
| *C23C 14/48* | (2006.01) |
| *C03C 21/00* | (2006.01) |
| *C30B 29/20* | (2006.01) |
| *C30B 31/22* | (2006.01) |
| *H01J 37/32* | (2006.01) |

(52) U.S. Cl.
CPC ............... *C23C 14/48* (2013.01); *C03C 21/007* (2013.01); *C30B 29/20* (2013.01); *C30B 31/22* (2013.01); *H01J 37/32412* (2013.01); *H01J 2237/202* (2013.01); *H01J 2237/20207* (2013.01); *H01J 2237/31701* (2013.01); *Y10T 428/24777* (2015.01)

(58) Field of Classification Search
CPC ....................................................... C30B 31/22
See application file for complete search history.

(56) References Cited

U.S. PATENT DOCUMENTS

| | | | |
|---|---|---|---|
| 4,088,799 | A | 5/1978 | Kurtin |
| 4,200,506 | A | 4/1980 | Dreschhoff et al. |
| 4,282,290 | A | 8/1981 | Pellicori |
| 4,316,385 | A | 2/1982 | DeVries et al. |
| 4,732,867 | A | 3/1988 | Schnable |
| 5,262,392 | A | 11/1993 | Hung et al. |
| 5,702,654 | A | 12/1997 | Chen et al. |
| 6,222,194 | B1 | 4/2001 | Regan |
| 6,413,589 | B1 | 7/2002 | Li |
| 6,562,129 | B2 | 5/2003 | Hasegawa et al. |
| 6,982,181 | B2 | 1/2006 | Hideo |
| 7,305,260 | B2 | 12/2007 | Vuori et al. |

(Continued)

FOREIGN PATENT DOCUMENTS

| | | |
|---|---|---|
| EP | 1585166 | 10/2005 |
| EP | 2388980 | 11/2011 |

(Continued)

OTHER PUBLICATIONS

Allen Kirkpatrick, Daniel C. Harris, and Linda F. Johnson. Effect of ion implantation on the strength of sapphire at 300-600° C. 2001. Journal of Materials Science. 26. 2195-2201.*

(Continued)

*Primary Examiner* — Dah-Wei D Yuan
*Assistant Examiner* — Kristen A Dagenais
(74) *Attorney, Agent, or Firm* — Brownstein Hyatt Farber Schreck, LLP

(57) ABSTRACT

Systems and methods for strengthening a sapphire part are described herein. One method may take the form of orienting a first surface of a sapphire member relative to an ion implantation device, selecting an ion implantation concentration and directing ions at the first surface of the sapphire member. The ions are embedded under the first surface to create compressive stress in the sapphire surface.

18 Claims, 18 Drawing Sheets

(56) References Cited

U.S. PATENT DOCUMENTS

| | | |
|---|---|---|
| 7,456,080 B2 | 11/2008 | Gadkaree |
| 7,478,570 B2 | 1/2009 | Mian et al. |
| 7,726,532 B2 | 6/2010 | Gonoe |
| 7,902,527 B2 | 3/2011 | Chen et al. |
| 7,910,862 B2 | 3/2011 | Yoshie |
| 8,309,431 B2 | 11/2012 | Nguyen et al. |
| 8,396,582 B2 | 3/2013 | Kaushal et al. |
| 2003/0166311 A1 | 9/2003 | Miyazawa |
| 2006/0019035 A1 | 1/2006 | Munz et al. |
| 2006/0060796 A1 | 3/2006 | Subramanian |
| 2007/0172661 A1 | 7/2007 | Fechner et al. |
| 2009/0081424 A1* | 3/2009 | Gomi ............ 428/195.1 |
| 2010/0096720 A1* | 4/2010 | Ohnuma et al. ....... 257/506 |
| 2010/0103140 A1 | 4/2010 | Hansson |
| 2011/0019123 A1 | 1/2011 | Prest et al. |
| 2011/0171429 A1 | 7/2011 | Huang et al. |
| 2011/0200760 A1 | 8/2011 | Park et al. |
| 2011/0204532 A1 | 8/2011 | Kinoshita et al. |
| 2011/0312115 A1 | 12/2011 | Kato |
| 2012/0015799 A1 | 1/2012 | Shonai |
| 2012/0236526 A1 | 9/2012 | Weber |
| 2014/0193606 A1* | 7/2014 | Kwong ............ 428/138 |

FOREIGN PATENT DOCUMENTS

| | | |
|---|---|---|
| JP | 5795899 | 6/1982 |
| KR | 20040023447 | 3/2004 |
| KR | 20110034889 | 4/2011 |
| KR | 20110039962 | 4/2011 |
| WO | WO2008/122296 | 10/2008 |
| WO | WO2009/128315 | 10/2009 |
| WO | WO2009/151160 | 12/2009 |

OTHER PUBLICATIONS

P.J. Nurnett and T.F. Page, An investigation of ion implantation-induced near-surface stresses and their effects in sapphire. 1985. Journal of Materials Science. 20. 4624-4646.*

Burnett, P.J. et al., "An investigation of ion implantation-induced near-surface stresses and their effects in sapphire and glass," Journal of Materials Science 20, Dec. 1985, vol. 20, Issue 12, 23 pages.

Demaree JD et al., "Modification of single-crystal sapphire by ion implantation," Nuclear Instruments & Methods in Physics Research, Section—B:Beam Interactions with Materials and Atoms, Elsevier, Amsterdam, NL, vol. 127-128, May 2, 1997, pp. 603-607.

Kirkpatrick A et al., "Effect of Ion Implantation on the Strength of Sapphire at 300-600° C.," Journal of Materials Science, Kluwer Academic Publishers, Dordrecht, vol. 36, No. 9, May 1, 2001, pp. 2195-2201.

Kobrin, P.H. et al., "Compressive thin films for increased fracture toughness," Proceedings of SPIE, vol. 683, Jan. 1, 1986-Aug. 19, 1986, 5 pages.

Liu, C.M. et al., "The effect of annealing, precipitation-strengthening, and compressive coating processes on sapphire strength," Materials Science and Engineering A: Structural Materials: Properties, Microstructure & Processing, Lausanne, Switzerland, vol. 420, No. 1-2, Mar. 25, 2006, 8 pages.

Saito et al., "Coloration of Sapphire by Metal-Ion Implantation," 362 Japanese Journal of Applied Physics, 24 (1985) Nov., No. 11, Part II, Tokyo, Japan.

International Search Report and Written Opinion, PCT Application No. PCT/EP2013/078173, 12 pages, May 2, 2014.

Partial European Search Report, EP Application No. 14155530, 8 pages, Jul. 2, 2014.

European Search Report, EP Application No. 14155530, 13 pages, Nov. 6, 2014.

Extended European Search Report, EP Application No. 14150283.1, 5 pages, May 2, 2014.

Extended European Search Report, EP Application No. 14150764, 6 pages, May 2, 2014.

U.S. Appl. No. 13/738,200, filed Jan. 10, 2013, Kelvin Kwong.

U.S. Appl. No. 13/736,676, filed Jan. 8, 2013, Kelvin Kwong.

* cited by examiner

SAPPHIRE PROPERTY MODIFICATION THROUGH ION IMPLANTATION

TECHNICAL FIELD

The present application is directed to sapphire materials and, more particularly, to the physical properties of corundum and other processed sapphire materials.

BACKGROUND

Corundum is a crystalline form of aluminum oxide and is found in various different colors, all of which are generally commonly referred to as sapphire except for red corundum which is commonly known as ruby and pinkish-orange corundum which is known as padparadscha. Transparent forms of corundum are considered precious stones or gems. Generally, corundum is extraordinarily hard, with pure corundum defined to have a hardness of 9.0 on the Mohs scale, and, as such, is capable of scratching nearly all other minerals.

As may be appreciated, due to certain characteristics of corundum, including its hardness and transparent characteristics, among others, it may be useful in a variety of different applications. However, the same characteristics that are beneficial for particular applications commonly increase both the cost and difficulty in processing and preparing the sapphire for those applications. As such, beyond costs associated with it being a precious stone, the costs of preparing the corundum for particular uses is often prohibitive. For example, the sapphire's hardness makes cutting and polishing the material both difficult and time consuming when conventional processing techniques are implemented. Further, conventional processing tools such as cutters experience relatively rapid wear when used on corundum.

SUMMARY

Systems and methods for strengthening a sapphire part are described herein. One method may take the form of orienting a first surface of a sapphire member relative to an ion implantation device, selecting an ion implantation concentration and directing (e.g., high energy) ions at the first surface of the sapphire member.

The ions are embedded into the sapphire member, and may create compressive stress in the sapphire surface. For example, the ions may be interstitially embedded under the first surface, between existing crystal lattice sites, in order to create a compressive stress in the sapphire surface. Alternatively, the ions may fill vacant sites in the sapphire lattice, or the ions may be embedded so as to make portions of the embedded region substantially amorphous or non-crystalline in nature.

Another embodiment may take the form of a system for ion implantation. The system may include an ion source configured to receive an element, an ion extraction unit coupled to the ion source that creates an ion stream, a redirecting magnet sequentially following the ion extraction unit, and a mass analyzing slit that filters the redirected ion stream. Additionally, the system may include an ion acceleration column that accelerates the filtered ion stream, a plurality of lenses for focusing the ion stream, a scanning unit that directs the ion stream into an end station, and a support member in the end station for supporting and manipulating the position of a sapphire part, in which the ions are embedded.

Plasma ion immersion may also be utilized as an ion implantation system or process. In plasma ion immersion, available ion energies may be somewhat lower than those achieved with ion beam implantation, with higher throughput. For example, a plasma ion immersion system for embedding ions into the surface of a sapphire component may include a plasma (ion) source, a vacuum chamber, and coupling mechanism for coupling the plasma source to the vacuum chamber. The vacuum chamber may include a slit valve and a turbomolecular pump or other pumping system to maintain low pressure. A power supply (e.g., a pulsed DC power supply) may be utilized to direct ions from the plasma source to the surface of a sapphire component, in which the ions may be implanted as described above.

Still other embodiments may take the form of a method of implanting ions into a sapphire member. The method may include applying an ion paste to two sides of the sapphire member and electrically coupling terminals to the ion paste. A terminal (e.g. a unique terminal) may be coupled to the ion paste on each side of the sapphire. Additionally, the method may include supplying an electrical current to the terminals and alternating a direction of the electrical current of the terminals.

Further, another embodiment may take the form of a sapphire window. The sapphire window may include a top surface implanted with ions to help strengthen a crystalline structure of the sapphire window. At least one edge surface of the sapphire window may be implanted with ions to help prevent cross talk into the sapphire window.

While multiple embodiments are disclosed, still other embodiments of the present invention will become apparent to those skilled in the art from the following Detailed Description. As will be realized, the embodiments are capable of modifications in various aspects, all without departing from the spirit and scope of the embodiments. Accordingly, the drawings and detailed description are to be regarded as illustrative in nature and not restrictive.

DETAILED DESCRIPTION

Figure 1:
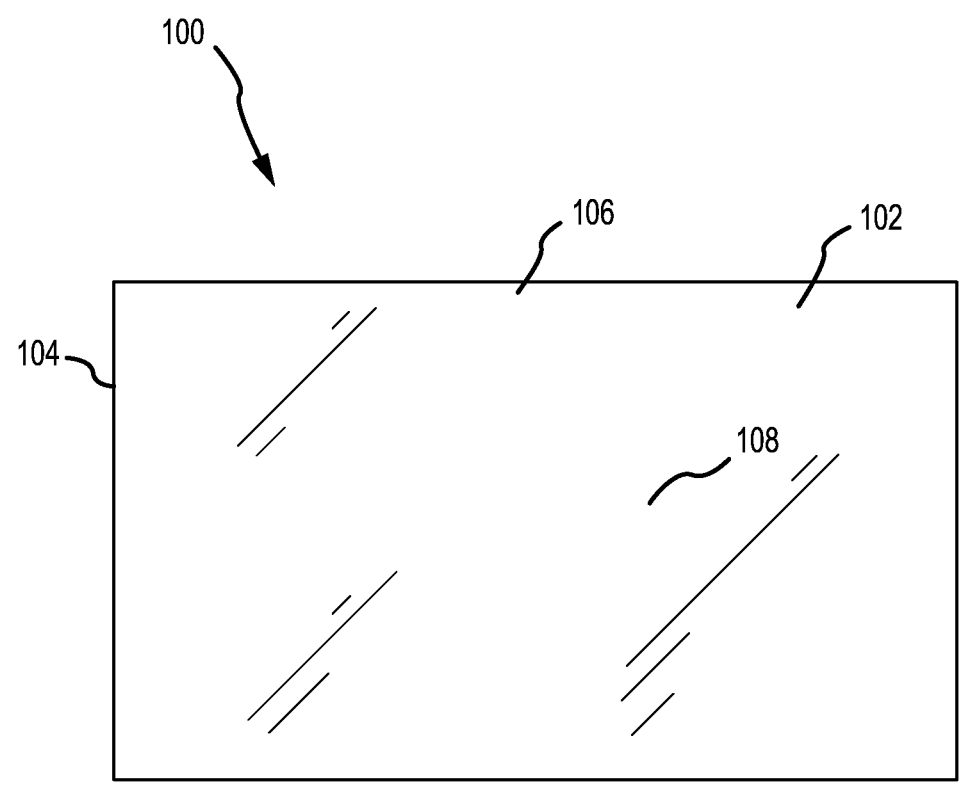
FIG. 1 illustrates an example sapphire part.

While sapphire's inherent strength is higher than that of glass, there is not a well established process like chemical strengthening to provide significant strength improvements after mechanical shaping. Failures in sapphire are typically driven by propagations of surface flaws under stress. Therefore, to improve the strength and robustness of sapphire, it may be useful to apply an ion implantation process to provide a strength enhancement.

The chemical strengthening process for glass, where diffusion substitutionally replaces smaller ions with larger ions, creates a compressive stress layer around the surface of the glass part that serves to prevent the propagation of surface cracks. In contrast, the instant ion implantation of sapphire bombards the sapphire part with high energy ions which are embedded interstitially or otherwise in the subsurface to create a similar thin layer or compressive stress that serves to arrest crack propagation. The sapphire ion implantation process results in a strained lattice to depths generally less than approximately 1 micrometer. The strengthening is achieved utilizing ions of nitrogen or argon, though this is not restrictive as a concentration of any ions could create the lattice strain necessary to have surface compressive stress.

The concentrations for strengthening may fall between approximately $10^{13}$ and approximately $10^{19}$ ions/cm$^2$. Other concentrations outside this range may also be implemented, however, care should be taken where low concentrations would not create enough lattice distortion to have a measurable strength effect and the high concentrations could cause surface degradation as the implanted ions may rupture the surface, thereby reducing the strength, or could create a structural change from crystalline to amorphous that could degrade the strength. The choice of ion and concentration may depend on the size of the ion, its energy, its charge, and its chemical interaction with sapphire, as these will determine the depth of the implanted layer, the amount of stress created at the surface and the resulting color of the sapphire, if any.

As impurities within sapphire can impart color, the specific application may dictate whether a colored or colorless appearance would be desired. Additionally, since ion implantation may be a line of sight process, masks could be used to shield different locations of the part for a desired effect. For example, perhaps the concentrations required to achieve the maximum strengthening lead to a color tint. In that case, ions could be chosen to create a more desired color in specific locations while minimizing the color tint in other areas. One plausible implementation of this concept is implanting high concentrations of ions around the exterior of a sapphire display to create a mask of a specific color (like iron and titanium which may create a dark color, such as black). Hence, the ion implantation may both improve strength in the vulnerable edges and also provide a desired color. A reduced concentration of potentially different ions may then be implanted over the display section to also provide strengthening but avoid coloring that would degrade the appearance of the display. This technique would enjoy the additional benefit of creating a mask that would appear within the sapphire rather than underneath as is the case with conventional ink back printing.

In some embodiments, the equipment available for the implantation process may influence both the depth of implantation and techniques implemented. For example, if an implanting device operates at or near 80 kilo-electron volts (keV), ions may be implanted at a first depth, whereas an implanting device operating at or near 160 keV may implant ions at a second depth which is deeper than the first depth. Hence, the use of different implant energies may provide for different stress profiles and protect against different types and/or depth of damage. In some embodiments, two (or more) implanting devices may be used to implant ions at two different depths. Plasma processes may also be utilized, in which the ions have different (e.g., lower) energy, and implantation occurs at other depths (e.g., at lesser depth, with respect to the implantation surface). Further, in some embodiments, a single implanting device may be configured to operate at two or more different energy levels to achieve a desired stress profile.

Additionally, during the implanting process, the atoms of the crystalline structure may be displaced. Specifically, as Ar, N, Ti, Fe, or other ions bombard the surface of the crystal, the Aluminum or Oxygen atoms may be displaced. To help preserve the integrity of the crystalline structure, Al or O ions may be reinserted through an ion implanting process subsequent to the initial implanting steps. For example, Argon may initially be implanted to achieve a desired strengthening profile and a subsequent implantation step may be performed to reinsert any Oxygen atoms that were displaced during the Argon implantation. One or more of the implanting steps may also be performed at an elevated temperature (e.g., between approximately 500 and 1800 degrees Celsius in some embodiments). For example, the Argon implanting step may be performed at an elevated temperature relative to the Oxygen step or vice-versa.

FIG. 1 illustrates an example sapphire part 100. The sapphire part 100 may be formed through any suitable process including, but not limited to, edge-defined film-fed growth (EFG), Kyropoulos, Verneuil, Czochralski, flux, hydrothermal, vertical horizontal gradient freezing ("VHGF"), and Bridgman (i.e., horizontal moving growth) processes. The sapphire part 100 may be cut from a sapphire wafer, a sapphire ribbon or other such sapphire member. The sapphire part 100 may take any suitable geometric shape and may be created for any suitable purpose. In one embodiment, for example, the sapphire part 100 may be generally have a rectangular shape and may be configured to serve as a cover glass in an electronic device. In other embodiments, the sapphire part 100 may have a circular shape and may be configured to serve as a cover glass for a camera.

One or more surfaces of the sapphire part 100 may be implanted with ions to help strengthen the part. Specifically, for example, a top surface 102 may be implanted with ions, as well as one or more edges 104. In some embodiments, a surface, such as the top surface 102 may have an implanted ion concentration gradient with regions having different concentrations of ions and/or different types of ions. For example, peripheral edge 106 of the top surface 102 may have a higher concentration of ions than the center 108 of the top surface. Additionally, or alternatively, the top surface 102 may be implanted with a different concentration of ions than the edges 104. Further, each of the edges 104 may have a different concentration of ions.

Additionally, or alternatively, the peripheral edge 106 of the top surface 102 may be implanted with different ions from the center 108. For example, the peripheral edge may be implanted with titanium ions and/or iron ions, while the center 108 may be implanted with nitrogen and/or argon ions.

It should be appreciated that other ions and/or other combinations of ions may be implemented. The edges 104 may also be implanted with different ions from those of the top surface 102 and/or one or more of the edges may be implanted with different ions from another edge. Further, the top surface and a bottom surface may have both different ion concentrations and/or different implanted ions.

Figure 2A:
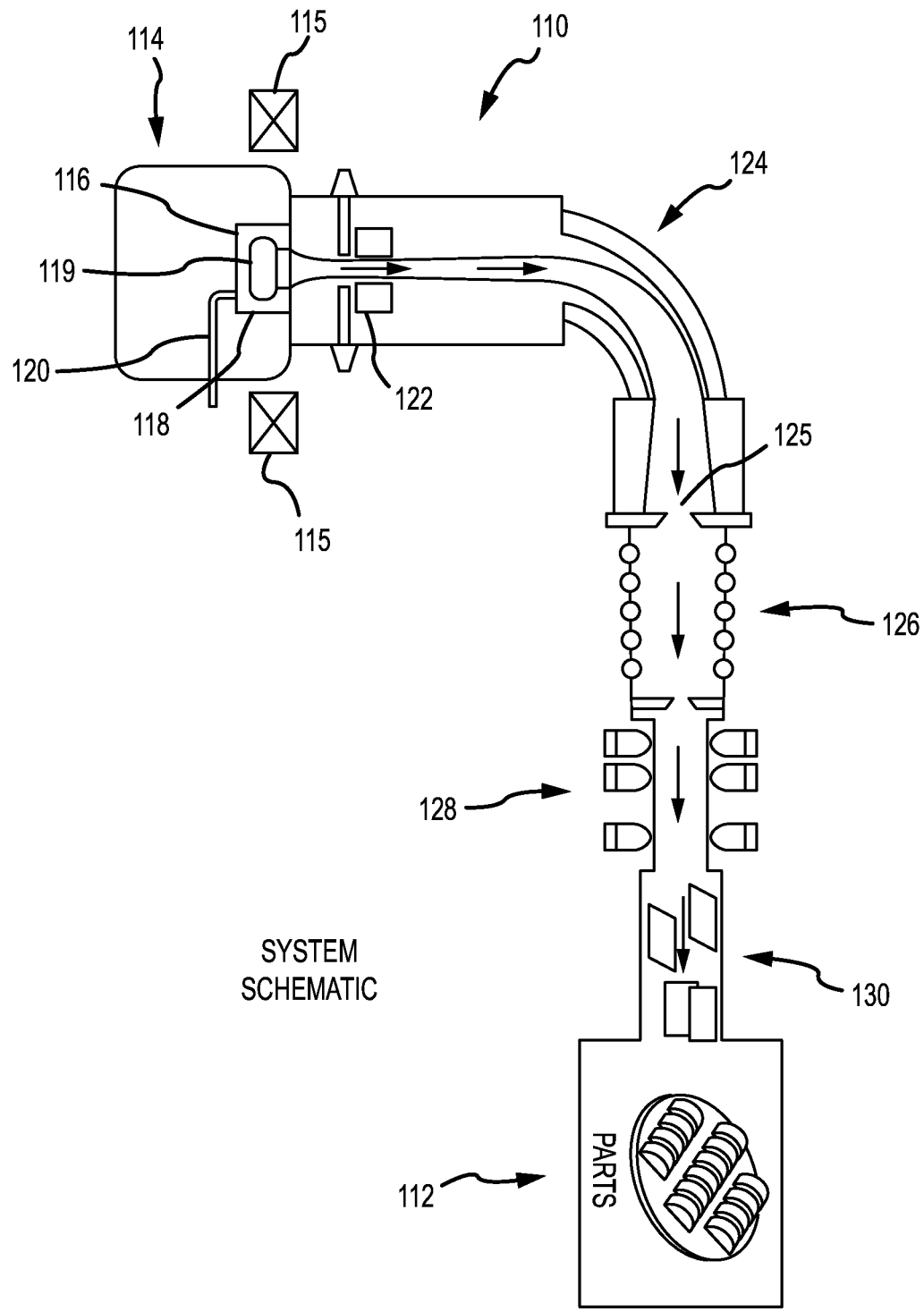
FIG. 2A illustrates an example ion implantation system for implanting ions into surfaces of the sapphire part of FIG. 1.

FIG. 2A illustrates an ion implantation system 110 for implanting ions into the sapphire part 100. Generally, the implantation system 110 may operate according to conventional techniques. Initially, the multiple parts 100 may be positioned in an end station 112 so that ions may be directed at and implanted in the part 100. The ions for implantation start at an ion source 114 with magnets 115. The ion source 114 includes a chamber 116 (or anode) and a filament (or cathode) 118. Magnets 115 are located about the ion source 114. An element such as titanium, argon, iron, nitrogen, or another element may be fed into the chamber 116 via an element source 120 and converted into a plasma. The element is passed through an ion extraction member/pre-acceleration unit 122 before a being redirected by a magnet 124 and filtered or separated by a mass analyzing slit 125. The ions are subsequently passed through an ion acceleration column 126. The ions are passed through magnetic quadrupole lenses 128 and an electronic scanning system or unit 130 before impacting the part.

Figure 2B:
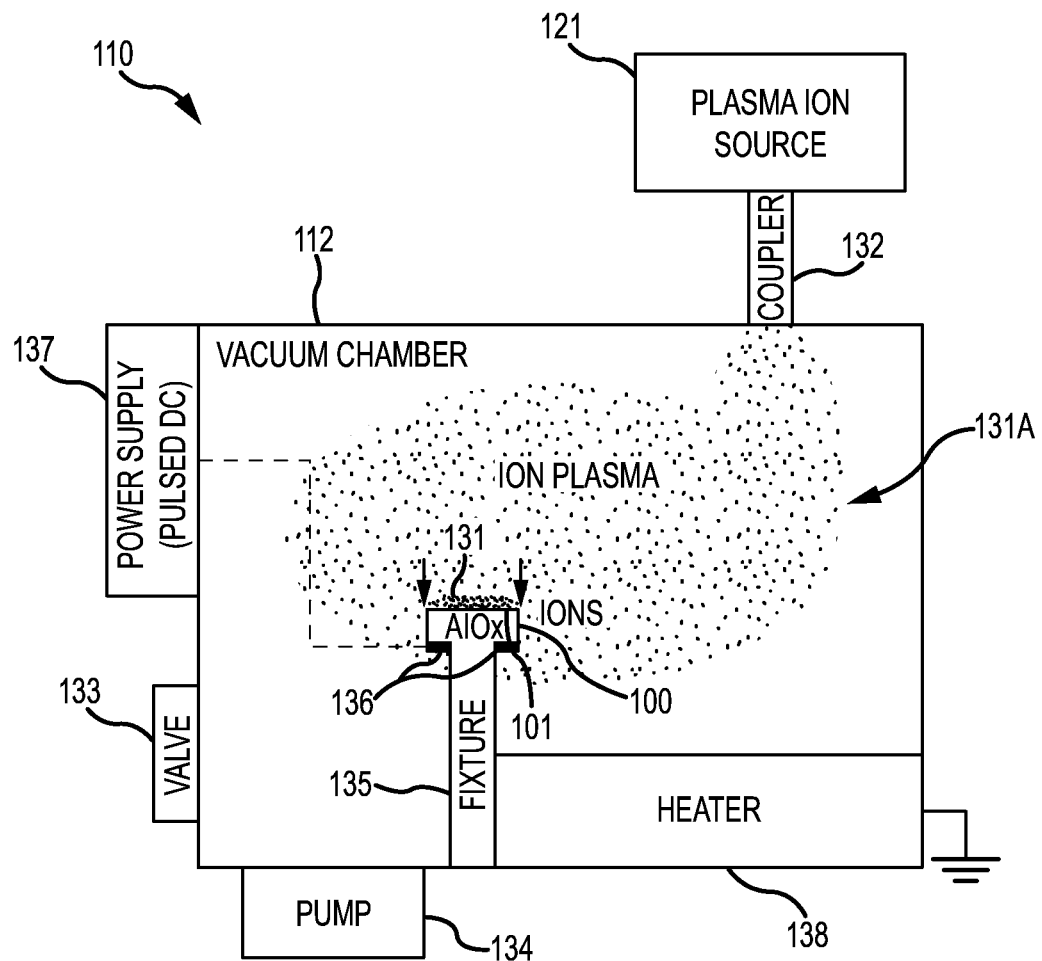
FIG. 2B illustrates an alternate ion implantation system for implanting ions into surfaces of the sapphire part.

FIG. 2B illustrates an alternate ion implantation system 110 for implanting ions into the sapphire part 100, via a plasma ion immersion process. In the particular configuration of FIG. 2B, for example, the implantation system 110 includes a vacuum chamber type end station 112 for implanting ions into a selected surface of a sapphire (crystalline aluminum oxide or AlOx) part or component 100, where the selected ions 131 are generated from an electron/ion plasma 131A.

The implantation ions 131 are provided by plasma ion source 121, which is configured to generate an electron/ion plasma 131A including the particular ions 131 that are selected for implantation into sapphire part 100, for example aluminum, oxygen, nitrogen argon, magnesium, titanium, copper, iron or chromium ions 131, or a combination thereof. Vacuum chamber end station 112 is coupled to plasma source 121 via a vacuum conduit or other coupling component 132. Vacuum chamber 112 may also include various vacuum valves and pump components 133 and 134, in order to maintain a desired low pressure suitable for performing plasma immersion ion implantation processing of sapphire part 100.

As shown in FIG. 2B, a cover glass or other sapphire part 100 is immersed or exposed to the plasma 131A, for example using a fixture or support member 135, so that the surface 101 selected for ion implantation is exposed to the selected ions 131. An electrode 136 is provided in contact or charge communication with the part 100, for applying a voltage to separate the selected ions 131 from the electron/ion plasma 131A, and to accelerate the ions 131 toward the selected surface 101.

A power supply 137 is provided to generate a selected implantation voltage on the electrode 136, for example a negative operating voltage $-V_0$ on the order of a few kilovolts (kV) in absolute value (e.g., about 1 kV to about 10 kV), or on the order of tens or hundreds of kilovolts (e.g., about 10 kV to about 100 kV, or more), so that the selected ions 131 are accelerated toward the implantation surface 101 of the sapphire part 100. In accelerating toward implantation surface 101, the ions 131 gain a kinetic energy of $K=qV_0$, where q is the absolute value of the ionic charge, for example $e$, $2e$, $3e$, etc., and in which e is absolute value of the fundamental charge on the electron.

Thus, the energy $qV_0$ represents an ion implantation energy, which can be selected by choosing the operating voltage $V_0$ and the ionization charge q (or the ionization level) to implant the ions 131 at a desired target depth (or in a desired target depth range) within the sapphire part 100. The implantation depth is defined with respect to the selected implantation surface 101, so that the selected ions 131 are implanted at the target depth beneath the implantation surface 101 of the sapphire part 100, or within the corresponding target depth range. The implantation depth also depends upon the size of the selected ions 131 and the corresponding cross section for scattering from the atoms in the crystal lattice of sapphire part 100, as well as the ionization order or charge q.

For example, the power supply 137 may operate in a pulsed DC mode, where the operating voltage $-V_0$ is imposed on the electrode 136 (and the sapphire part 100) for a relatively short time, as defined by the plasma frequency of the electron/ion plasma 131A, for example on the order of a few microseconds or more (e.g., about 1 μs or less to about 10 μs or more). During the DC pulse, the electrons in the electron/ion plasma 131A are repelled away from the selected ion implantation surface 101, due to the negative charge pulse $-V_0$ imposed on the sapphire part 100 by the electrode 136.

At the same time, the selected ions 131 are accelerated toward the sapphire part 100, and are implanted at the desired target depth or range beneath the selected ion implantation surface 101, based on the implantation energy, charge, and scattering cross sections, as described above. Alternatively, a substantially constant DC voltage may be applied, over an implantation time of substantially more than 1-10 μs, for example on the order of milliseconds, or on the order of seconds or more. The implantation time may be determined, for example, depending on ion selection, plasma density, charge number, and other parameters, as compared to the desired ion surface density and target depth, and the resulting compressive stress, color, transparency and opacity of the sapphire part 100 proximate the selected ion implantation surface 101.

In some designs, the vacuum chamber end station 112 may also include a heater 138 or other device configured to heat the sapphire part 100, for example via a conductive path utilizing fixture 135, or by heating the sapphire part 100 together with the interior of vacuum chamber 112 via a combination of conduction, radiation, and convection. In these designs, the sapphire part 100 may be heated to a sufficient diffusion temperature such that the selected ions 131 diffuse to a greater depth than the target depth, beneath the selected surface 101 of the sapphire part 100.

Heating may be conducted at low pressure within vacuum chamber 112, or in an inert atmosphere at higher pressure. For example, the sapphire part 100 may be heated to a diffusion temperature of about 500° C. to about 1800° C., e.g., for a diffusion period of minutes or hours, so that the selected ions 131 diffuse to a greater depth than the target depth, beneath the selected ion implantation surface 101 of the sapphire part 100. In general, the diffused ions will maintain a diffused concentration sufficient to generate compressive stress in the selected ion implantation surface 101 of the sapphire part 100, as described above.

Additional ions 131 may also be embedded into the selected surface 101, either before or after heating the sapphire part 100 to diffuse the selected ions 131 to greater depth, or during the heating process. For example, the additional ions 131 may be embedded at the original target depth (e.g., using the same implantation energy or pulse voltage $V_0$), or at another target depth (e.g., using a different implantation energy or pulse voltage $V_0$). Similarly, the additional ions 131 may be generated from the same element as the original ions 131, as embedded or implanted into the selected surface 101 before heating the sapphire part 100 to the diffusion temperature. Alternatively, the plasma ion source 121 may be configured to generate the selected ions 131 from different elements, for embedding into the selected surface 101 before, during or after heating the sapphire part 100 to the diffusion temperature.

The power supply 137 may also be configured to generate the operating voltage $V_0$ with a gradient across the electrode 136, such that the selected ions 131 are embedded into the selected surface 101 of the sapphire part 100 at different depths or concentrations, as defined along the voltage gradient, based on the corresponding gradient in the implantation energy. For example, electrode 136 may be provided in segmented form, as shown in FIG. 2B, with different voltages applied to different electrode segments, in order to generate the desired voltage gradient across the selected surface 101 of the sapphire part 100, and thus to generate corresponding gradients in the implantation depth or density of the implanted ions 131.

In additional examples, the sapphire part 100 may be masked, for example by utilizing electrodes 136 as the masking structure, or using a different masking material. In these applications, the selected surface 101 is exposed to the ions 131 in the electron/ion plasma 231, while at least one other surface of the sapphire part 100 is masked, so that the ions 131 are embedded into the selected surface 101, and the ions 131 are not embedded into the other (masked) surfaces of sapphire part 100, which are covered by electrodes or other masking elements 136.

Figure 3:
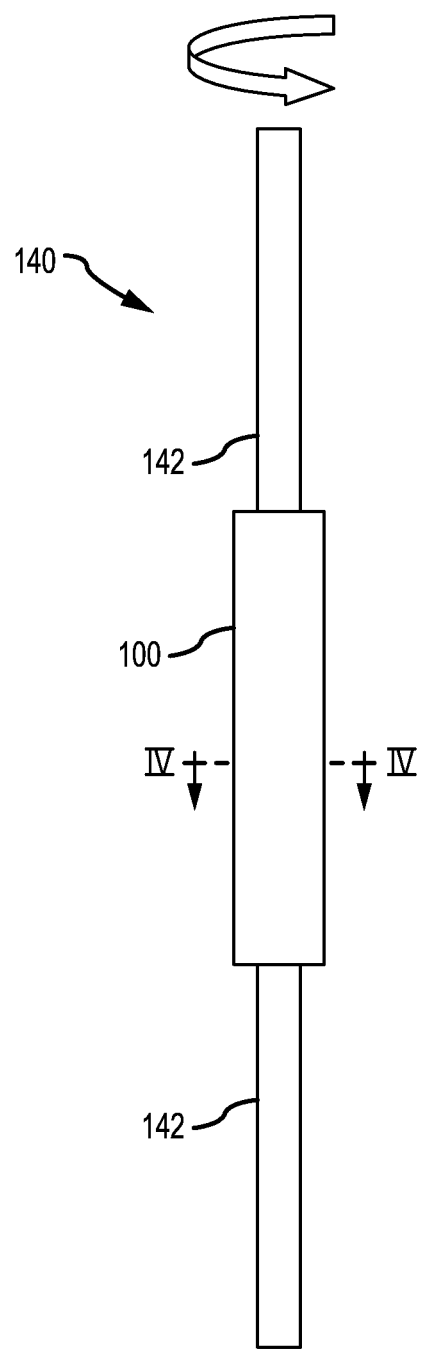
FIG. 3 illustrates a support member of the ion implantation system of FIG. 2A or 2B, for supporting the sapphire part during the ion implantation process.

FIG. 3 illustrates a support member 140 of the end station 112 that supports the sapphire part 100. The support member 140 may generally include two opposing structures 142 that pinch upon the sapphire part 100 to secure the sapphire part. Due to the hardness of the sapphire, there is generally little concern that the opposing structures 142 will damage the sapphire part 100. However, in some embodiments, a cushioning member or members may be provided at the interface between structures 142 and the sapphire part 100. The support member 140 may be configured to move and or rotate so that multiple sides of the sapphire part 100 can be exposed to the ions. As may be appreciated, there may also be multiple or many support members in the end station, supporting multiple or many sapphire parts.

FIGS. 4-7 are partial cross-sectional views of the sapphire part 100, for example as taken along line IV-IV in FIG. 3. It should be appreciated that the present drawings are not done to scale and are intended to merely be illustrative of the concepts set forth herein. As such, the drawings should not be read as limiting or as expressing size, dimensions or exact relationships of the illustrated items.

Figure 4:
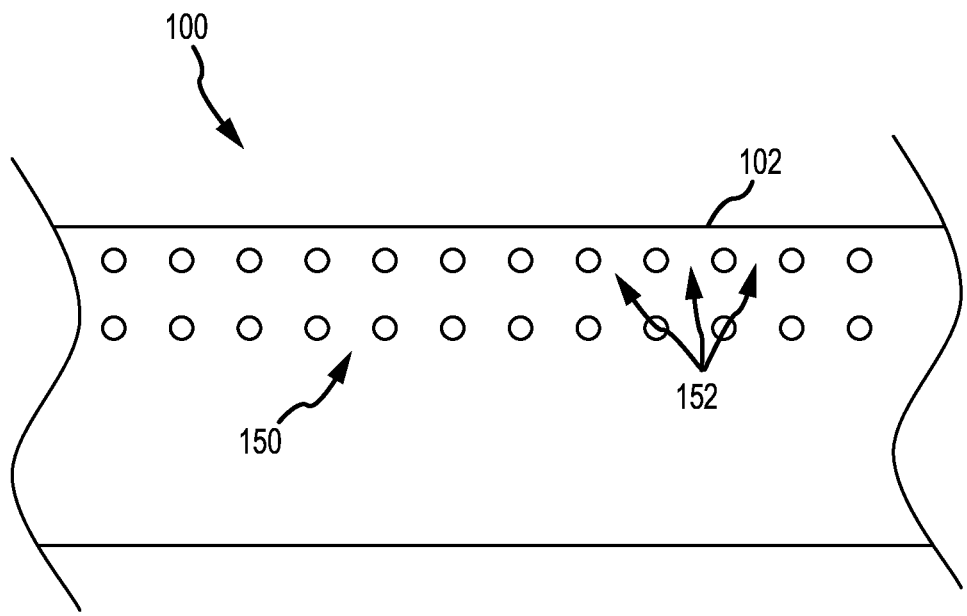
FIG. 4 is a partial cross-sectional view of the sapphire part taken along line IV-IV of FIG. 3 and showing a lattice crystalline structure.

FIG. 4 shows a lattice crystalline structure 150 of the sapphire part 100. As discussed above, in the present ion implantation process, ions may be implanted into an interstitial space 152 of the lattice crystalline structure 150. Alternatively, the ions may replace existing atoms in the sapphire lattice or fill vacant sites in the sapphire lattice, or the ions may be embedded so as to make portions of the embedded region substantially amorphous or non-crystalline in nature.

For example, ions may penetrate to a primary lattice layer or site in lattice 150 and displace an existing (e.g., aluminum or oxygen) atom, or occupy an empty site in primary lattice 150, so that the implanted ions are disposed within the primary crystalline structure of sapphire part 100. Alternatively, ions may penetrate to and occupy interstitial sites 152, forming a secondary lattice structure as shown in FIG. 5.

Figure 5:
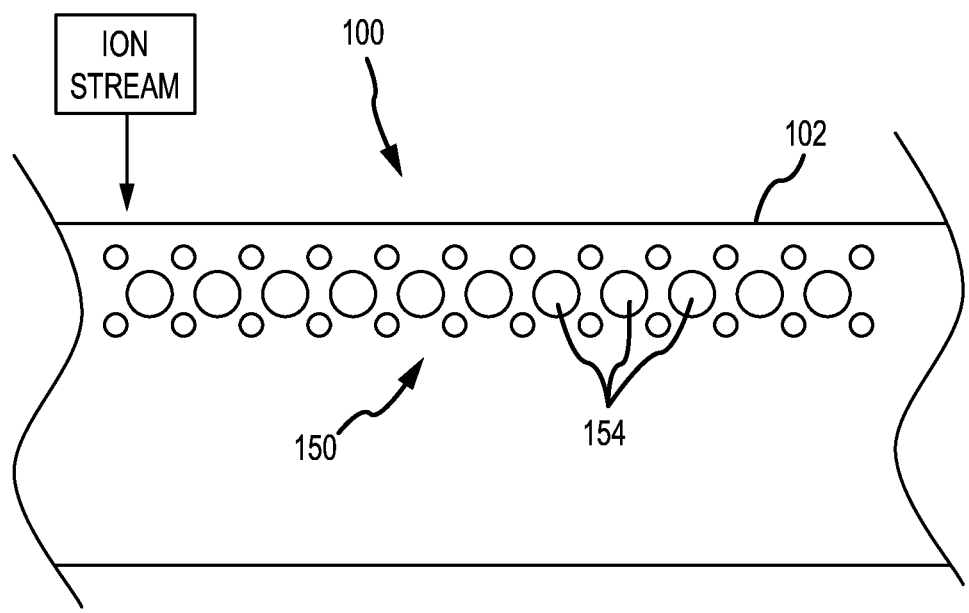
FIG. 5 is a partial cross-sectional view of the sapphire part taken along line IV-IV of FIG. 3 and showing ions implanted in the lattice crystalline structure.

FIG. 5 shows ions 154 implanted into the sapphire part 100, for example into the interstitial space 152. The implantation of ions 154 into interstitial spaces 152 (or otherwise implanted into the sapphire part 100) may create a compressive layer within the sapphire structure that helps to prevent the propagation of cracks or defects within the surface of the sapphire part 100.

For example, implanted ions 154 may occupy interstitial sites 152 as shown in FIG. 4, forming a secondary lattice structure or secondary lattice layer disposed within or between the primary (e.g., sapphire) crystalline lattice of part 100, as shown in FIG. 5. Alternatively, implanted ions 154 may occupy sites in primary lattice 150, as described above. Implanted ions 154 may also generate local disruptions in the lattice structure, forming a localized area of amorphous (non-crystalline) material in an embedded ion region, within the surrounding primary lattice 150 of sapphire part 100. The implanted ions may be +1 ions, +2 ions, or of another ionic level.

Figure 6:
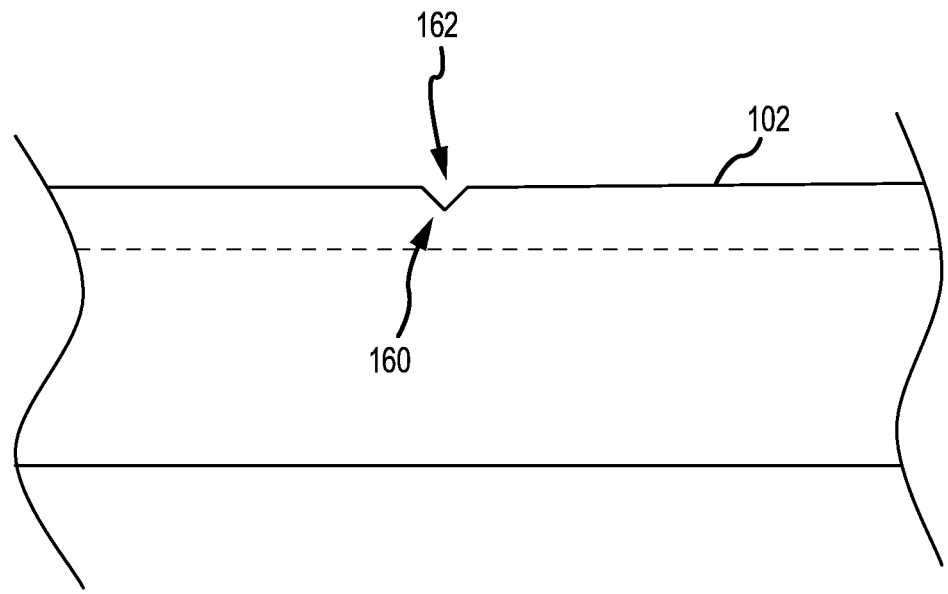
FIG. 6 is a partial cross-sectional view of the sapphire part taken along line IV-IV of FIG. 3 and showing a compressive layer, for example to reduce or prevent crack propagation in the sapphire part.

FIG. 6 illustrates the compressive layer 160 and a crack 162 or defect in the surface 102. The compression provided by the implanted ions 154 on the lattice crystalline structure prevents the crack 162 from expanding. Thus, the implanted ions help to preserve the integrity of the sapphire part, for example should a defect or crack develop due to stresses such as drop events that result in the sapphire part impacting a hard surface.

Figure 7:
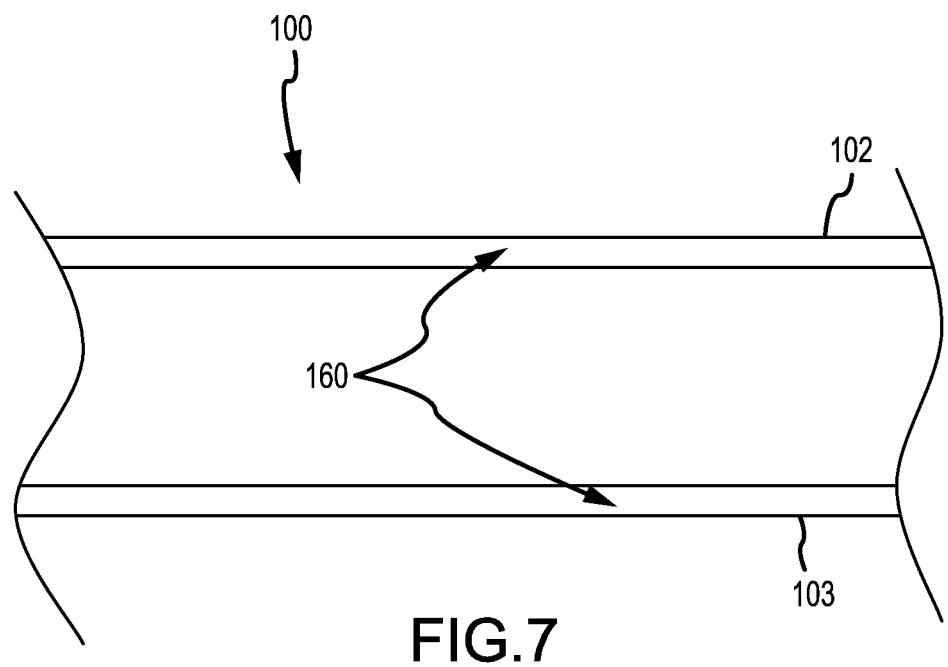
FIG. 7 is a partial cross-sectional view of the sapphire part taken along line IV-IV of FIG. 3 and showing a compressive layer on both top and bottom surfaces of the sapphire part.

FIG. 7 shows both a top surface 102 and a bottom surface 103 of the sapphire part 100 having a compressive layer 160 created through ion implantation. In some embodiments, the top surface 102 and/or a portion of the top surface may be implanted with different ions and/or a different concentration of ions than the bottom surface 103. It should be appreciated that in other embodiments, one of the surfaces may not be implanted with ions. This may be the case when one of the surfaces is not to be exposed externally from a device housing, thus limiting its exposure to defect inducing impacts and other operational effects.

The concentration of implanted ions may generally be between approximately $10^{13}$ and approximately $10^{19}$ ions/cm$^2$. However, in some embodiments, the concentrations may be greater than or less than that range.

Figure 8:
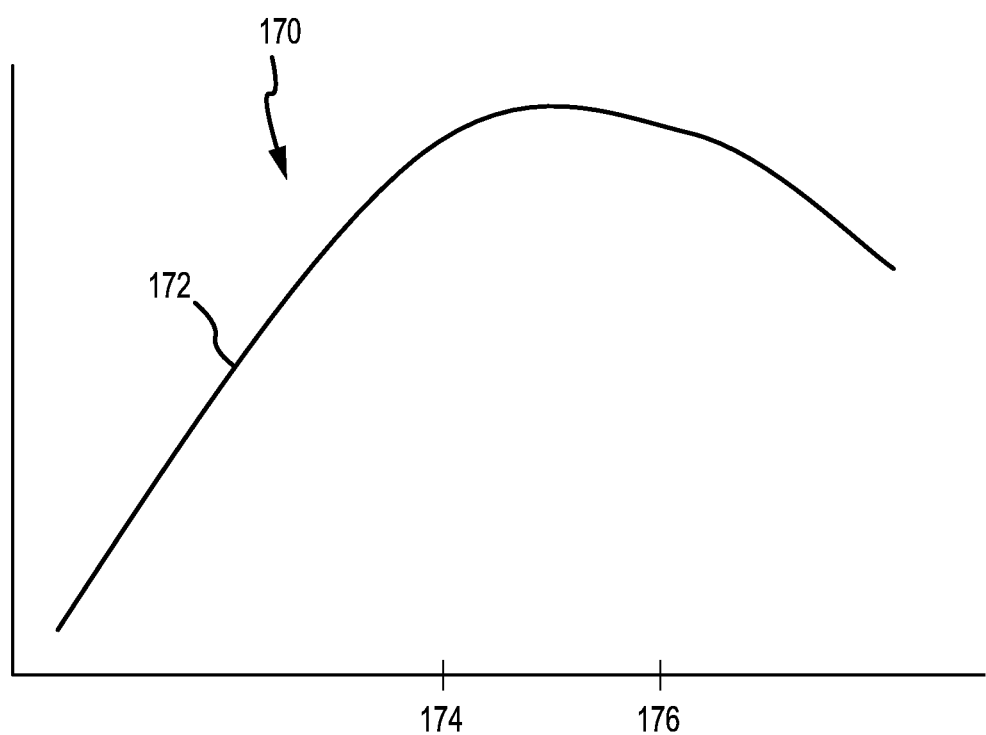
FIG. 8 is a plot illustrating the strength of the sapphire part relative to the concentration of ions implanted in the sapphire part.

FIG. 8 illustrates a graph 170 plotting strength versus ion concentration in a sapphire part. Specifically, the horizontal axis represents the concentration of implanted ions and the vertical axis illustrates the strength of the sapphire structure. As shown by the curve 172, as ions are implanted to certain concentrations, the strength of the sapphire structure increases before beginning to decrease after a threshold level of concentration has been exceeded. For the purposes of illustration, a concentration of about $10^{13}$ ions/cm$^2$ may be at or near a first mark 174 on the horizontal axis and a concentration of about $10^{19}$ ions/cm$^2$ may be at or near a second mark 176. Generally, the concentration of ions should be at a level that provides increased strength. As the curve 172 shows, an excessive concentration may decrease the strength of the sapphire.

Figure 9:
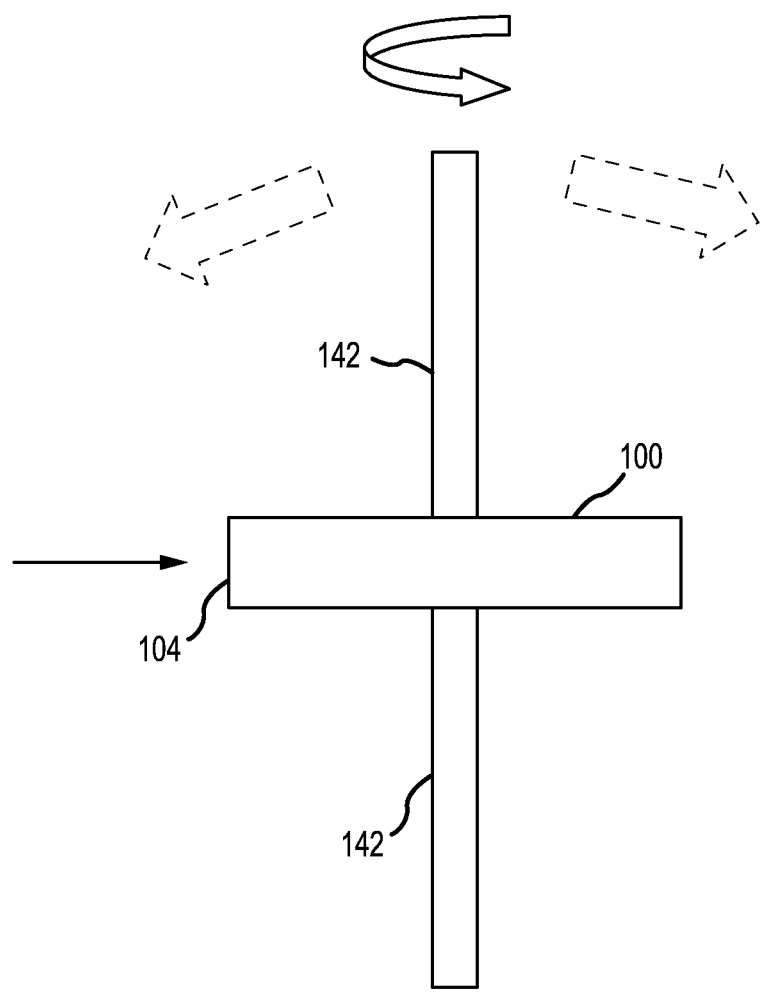
FIG. 9 illustrates the support member of FIG. 3 holding the sapphire part so that edges of the part may be bombarded with ions.

Although much of the foregoing discussion is related to the surfaces of the sapphire part 100, it should be appreciated that the edges 104 of the sapphire part may also have ions implanted therein and the foregoing applies to the edges 104 of the sapphire part 100 as well. Specifically, the support member 140 of FIG. 3 may be configured to hold the sapphire part 100 in a manner that allows the edges to be impacted by the ion stream, as shown in FIG. 9. The edges 104 may be implanted with the same or different ions from the top and/or bottom surfaces 102, 103 and at the same or different concentrations. The support member 140 may be configured to rotate so that all edges 104 of the sapphire part 100 may be exposed to ion implantation. Additionally, the support member 140 may be configured to move in different directions to accommodate an edge shape. For example, the support member 140 may tilt so that ions may more directly impact a straight or chamfered edge, or other edge structure.

Figure 10:
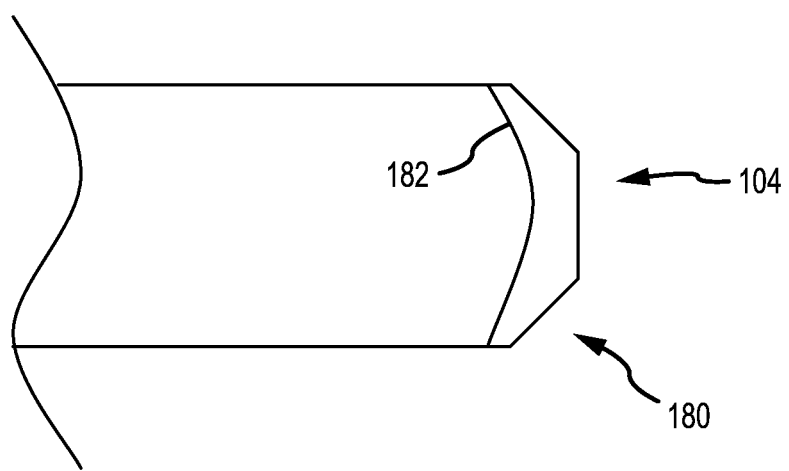
FIG. 10 illustrates a chamfered edge of a sapphire part with a curve indicating the concentration of the ions.

FIG. 10 illustrates a chamfered edge 180 of a sapphire member. Additionally, a curve 182 on the chamfered edge illustrates the relative concentration of ion implantation. As shown, the ions may be more concentrated at or near a flat portion of the edge 180, as it may receive the ion stream most directly. The slanted portions of the edge 180 may have a lower concentration of ions. In some embodiments, however, the concentration may be consistent across all parts of the edge 180. For example, in embodiments where the support member 140 is able to tilt, the slanted edges may be directly impacted by the ion stream, and the ion concentration may vary across the edge 180, or be substantially consistent or substantially the same across the edge 180.

One of the limits of ion implantation may be the depth of the treatment. Generally, ion implantation may be limited to a maximum depth of approximately 1 micrometer, as defined with respect to the implantation surface. As such, there is a risk that either processing defects or handling damage could introduce scratches or defects that penetrate the surface of the material deeper than the treated layer and, therefore, limit its effectiveness in preventing crack propagation. To improve the process, ion implantation could be completed serially with high temperature heat treatments being completed in between each implantation step, or between one or more consecutive implantation steps.

In these embodiments, an implantation may be completed which would lead to lattice strain to a depth of x. By treating the material at high temperature, diffusion would allow the implanted ions to diffuse deeper into the material to x+y, while decreasing the ion concentration at the surface. Then another implantation step could be completed to again raise the ion concentration level at the surface. These steps may be completed repeatedly to yield a final treated layer with the same level of surface stress of a regular single treatment, but with a greater ion penetration depth than would have been otherwise possible.

Figure 11:
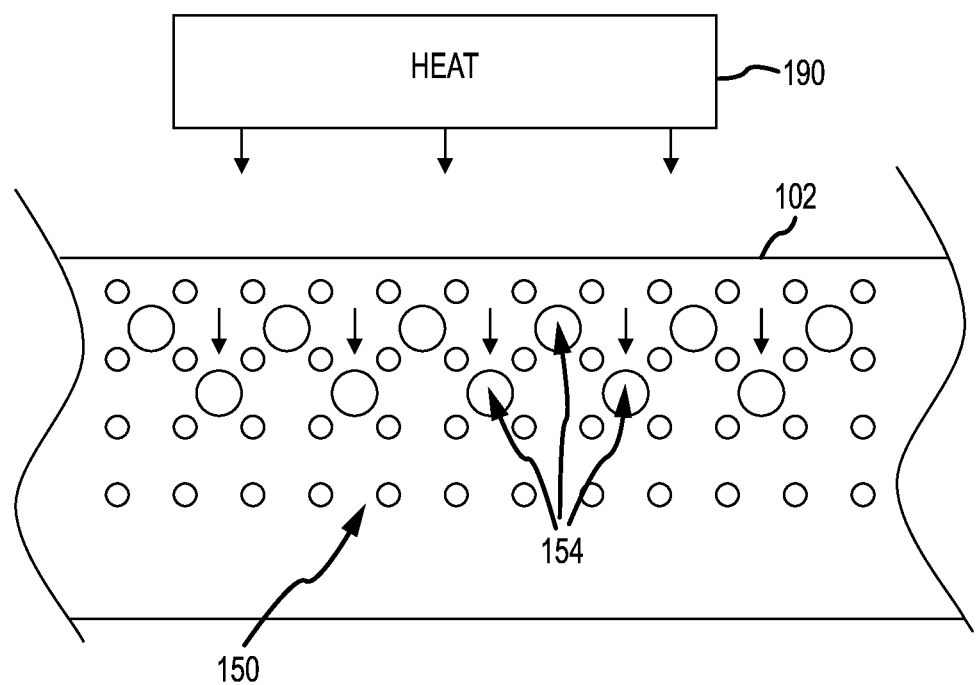
FIG. 11 illustrates a heating step for diffusing ions further into the lattice crystalline structure.

FIG. 11 illustrates ions diffusing into deeper lattice layers through a heating step. A heat source 190 may be provided to heat the surface 102 or to heat the sapphire part 100. As the sapphire part is heated, lattice structure 150 may be relaxed and the ions 154 may diffuse into deeper layers of the lattice structure. In some embodiments, the end station 112 or vacuum chamber (FIG. 2A or FIG. 2B) may serve as an oven or may otherwise be heated so that the sapphire part 100 is not moved between the heating and implanting steps. In other embodiments, multiple batches of sapphire parts may be staggered and alternate between heating and ion implantation steps, so that as one batch is in the end station 112, another batch may be heated, for example in an oven outside of the end station 112, or in an end station oven 112.

Figure 12:
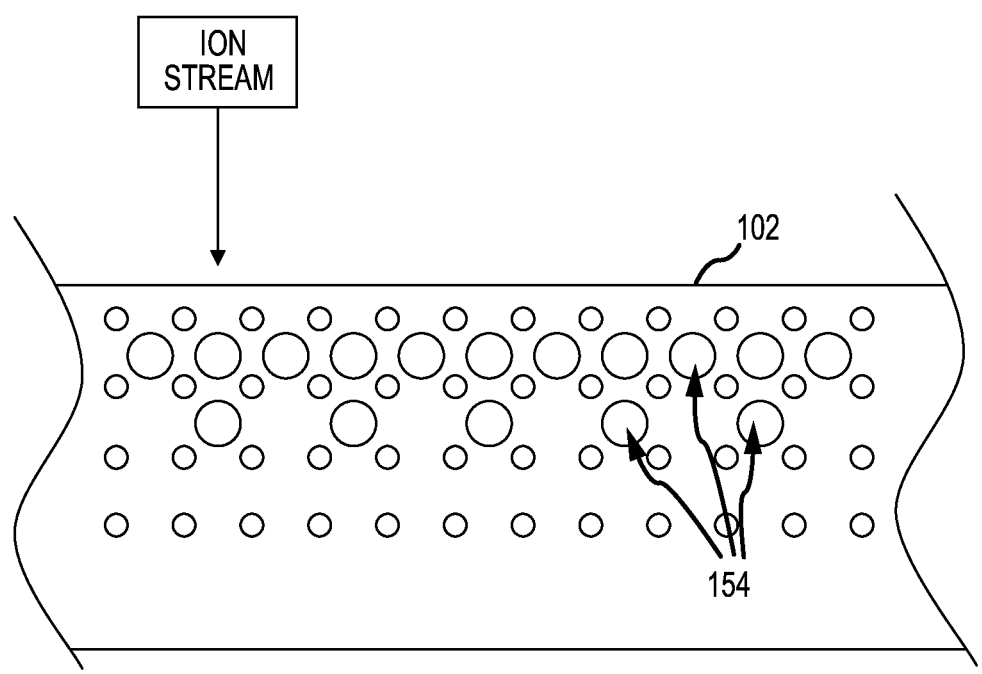
FIG. 12 illustrates an ion implantation step following the heating step of FIG. 11 to increase the concentration of ions at the surface of the sapphire part.

Diffusion may reduce the concentration of ions in the outer layer, proximate or adjacent the implantation surface. As such, a subsequent ion implantation step may be utilized to replenish the ions in the outer layer, as shown in FIG. 12. Through the combination of implantation and heating steps, ions may be implanted deeper into the lattice structure to help prevent against defect propagation at layers beneath the surface.

In some embodiments, multiple heaters and/or multiple ion implantation systems may be implemented. In one embodiment, a first ion implanter may implant ions of a first element and second ion implanter may implant ions of a second element to achieve a desired effect. In between each ion implantation step, or between two or more consecutive ion implantation steps, a heater may be used to help diffuse the previously implanted ions.

Figure 13:
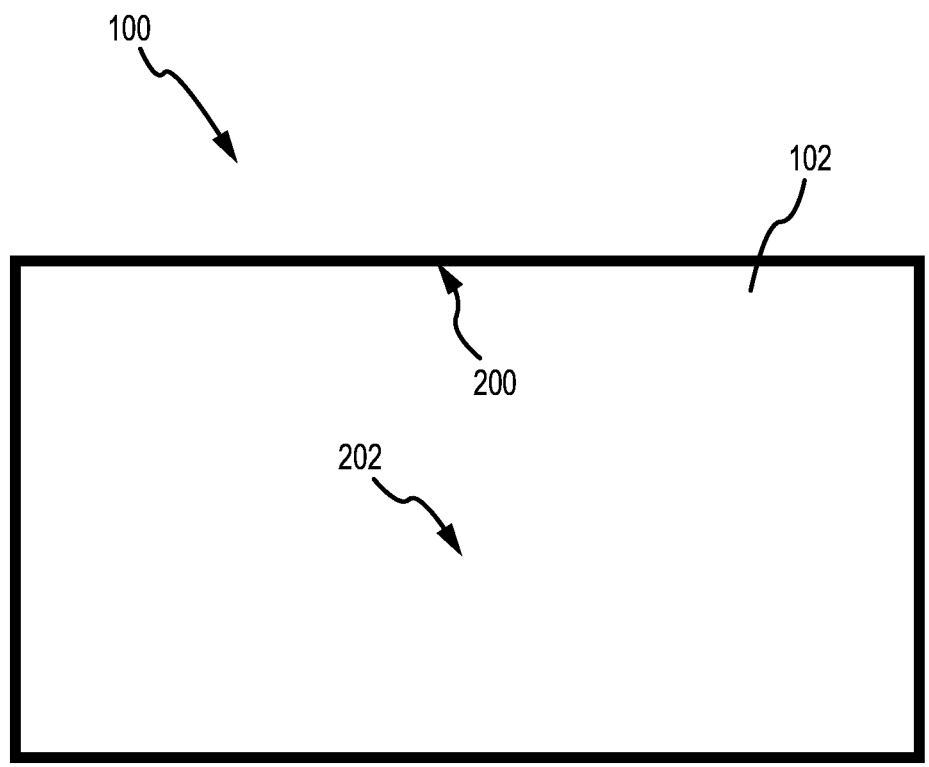
FIG. 13 illustrates the sapphire part of FIG. 1 having different zones of ion implantation to achieve a desired effect such as colorization of a zone.

FIG. 13 illustrates the part 100 after ion implantation, where a first zone 200 of the top surface 102 is colored (e.g., blackened or given another color) by the implanted ions and a second zone 202 remains substantially clear or transparent. Generally, the first zone 200 may include a peripheral portion of the top surface 102 and the second zone 202 may include the central portion of the top surface. In some embodiments, masks may be used during the ion implantation process to create the different (e.g., clear and colored) zones.

Figure 14:
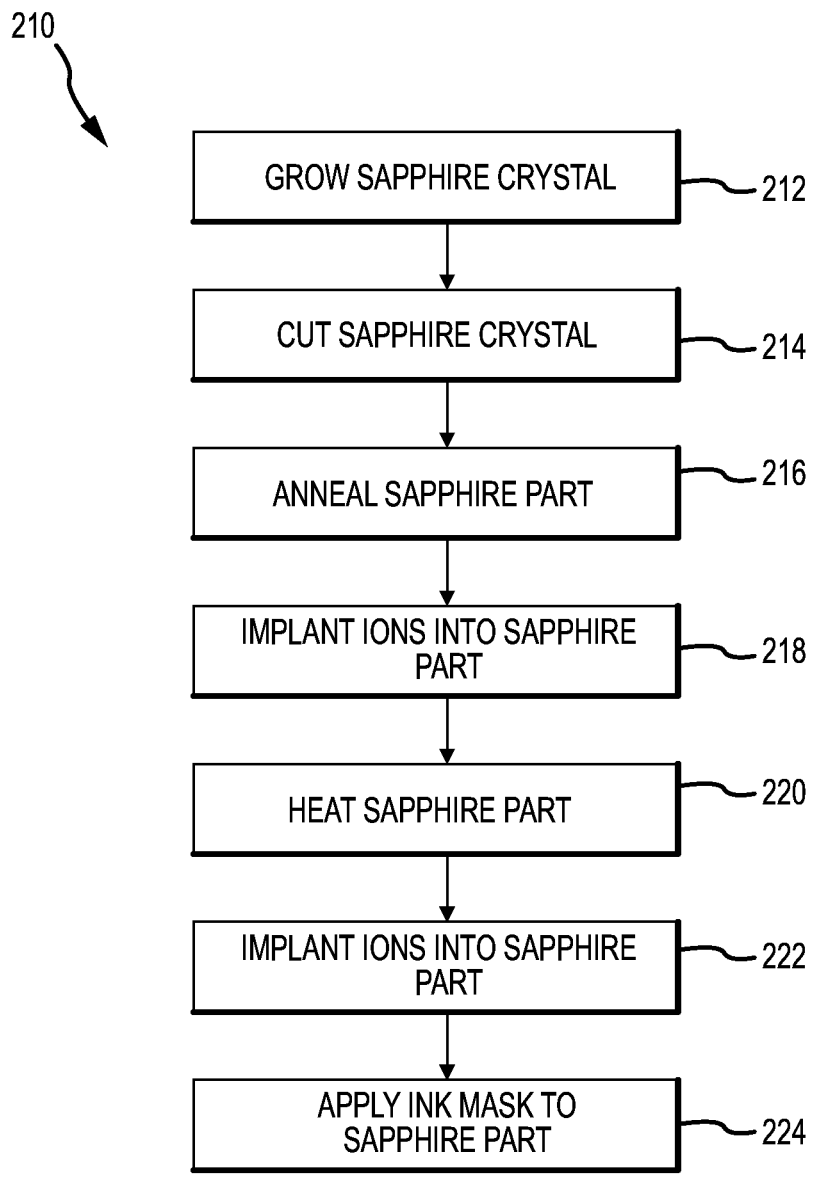
FIG. 14 is a flowchart illustrating a method of ion implantation in accordance with an example embodiment.

From a process perspective, ion implantation may be performed after post-processing annealing and prior to decoration as the implantation may damage or affect any surface inks or coatings, and could be expected to be most successful on a surface with minimized defects. FIG. 14 is a method 210 of processing a sapphire part in accordance with an embodiment of this disclosure.

Initially, a sapphire crystal is grown (Block 212). The sapphire crystal may then be cut (Block 214) to shape the sapphire part, which is then passed through an annealing process (Block 216). One or more surfaces of the sapphire part may then be bombarded with ions of an ion stream for ion implantation (Block 218). During ion implantation, the sapphire part position may be manipulated relative to the ion stream in order to properly implant ions into each surface desired. Additionally, certain regions of the sapphire part may be masked during one or more ion implantation steps to achieve a desired concentration, and/or a desired ion selected for implantation into certain regions and not others. The sapphire part may then be heated to cause diffusion of the ions into deeper lattice layers (Block 220).

After heating, the sapphire part may again be bombarded with ions (Block 222). The ion implantation, manipulation, masking, and heating/diffusion steps may be repeated in any order, number or combination, in order to achieve desired ion selection, implantation depth, concentration, color, and other properties.

Subsequently, post-processing steps such as ink mask application may be performed (Block 224). Typically, there would not likely be a polishing step after ion implantation, in order to preserve compressive stress and other desired properties. Alternatively, a light polish step or other post-implantation surfacing process may be applied, after ion implantation into the surface.

Other techniques may be implemented to implant ions into the sapphire lattice structure, interstitially or otherwise. For example, in some embodiments the sapphire member may be coated with an ionic slurry or paste and an electrical current may be applied to the slurry, in order to embed selected ions in selected surface, to a selected depth. Alternatively, a plasma immersion process may be utilized, as described above, either alone or in any combination with ion beam deposition, ionic slurry, and other ion deposition methods.

Figure 15:
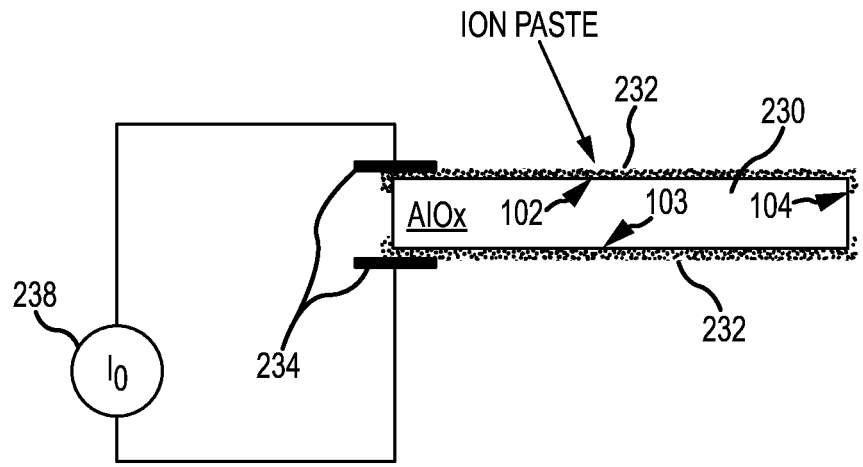
FIG. 15 illustrates a system for ion implantation into a sapphire structure in accordance with an alternative embodiment.

FIG. 15 illustrates an ionic slurry process. In particular, a sapphire member 230 is shown with an ion paste 232 coating on one or both (or each) side 102, 103 of the sapphire member 230. Electrical terminals 234 (e.g., singular, unitary or unique terminals having opposite voltages $\pm V_0$) are electrically coupled to the ion paste 232 or sapphire member 230, and an electrical current $\pm I_0$ is applied to the ion paste through the terminals 234, for example using a current supply or power supply 238.

Specifically, the terminals 234 may apply opposite charges or voltages $\pm V_0$ on the different (e.g., major opposing) sides 102, 103 of the sapphire member 230, so that ions flow across the selected implantation surface (e.g., the top or bottom surface 102 or 103). The charge or bias voltage of the terminals 234 may be somewhat lower than in ion beam and plasma deposition processes, and also may be alternated, so that ions in ion paste 232 are implanted into each side 102 and 103 of the sapphire part or member 230, or into the edges of the sapphire member 230, or into a combination of the sides 102, 103 and edges 104 of the sapphire member 230. That is, the cathode and anode may be switched (or one grounded terminal 234 and another terminal 234 with voltage $\pm V_0$ may be used), to provide an alternating current (AC) or direct current (DC) bias for implanting ions in ionic paste or slurry 232 to selected sides 102, 103 and/or edges 104 of the sapphire member 230.

Figure 16:
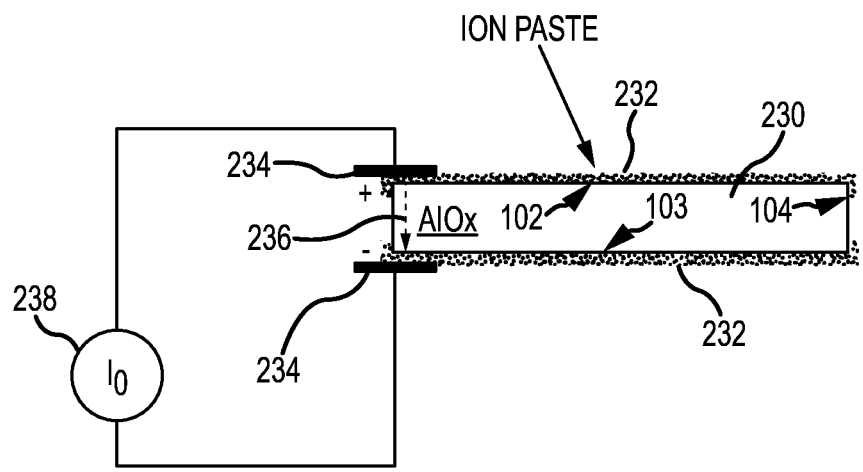
FIG. 16 illustrates the system of FIG. 15 with terminals biased for ion flow.

FIG. 16 illustrates the biasing of the terminals 234 to cause (e.g., positive) ion flow in the direction of the arrow 236. Any suitable power supply 238 may be used to apply the electrical current $\pm I_0$ to the ion paste 232. For example, in some embodiments, an alternating current (AC) $\pm I_0$ may be applied to the ion paste 232 to implant the ions. In other embodiments, a direct current (DC) $\pm I_0$ may be applied to the ion paste 232, and periodically the polarity of the terminals 234 may be switched. In still other embodiments, one or more switched capacitors may be included in power supply 238, and used to provide impulse charges to the terminals 234.

Generally, diffusion into the sapphire member 230 may be faster than diffusion out of the sapphire member, so that upon completion of the process there are ions implanted into the sapphire, for example interstitially or by substitution into the crystal lattice. Alternatively, ions may occupy empty lattice sizes, or form a region of substantially amorphous structure, within the crystal lattice. The ion paste 232 may include at least one ionic element and a suitable medium (or suitable media) for the selected ionic element. The selected ions or ionic elements may have size and chemistry generally the same as or similar to that of ions in the magnetic quadrupole lens and plasma immersion systems, as described above.

It should be appreciated that the ion implantation system illustrated in FIGS. 15 and 16 may also be implemented together with the above-described heating steps to help the ions further diffuse into the lattice crystalline structure of the sapphire. In some embodiments, the heat may be applied while the ion paste 232 is still on the surface of the sapphire member 230, while in other embodiments the ion paste may be removed prior to the heating step. In still other embodiments, the ion implantation process may be conducted in a furnace or an oven such as a vacuum furnace end station or finishing chamber 112, so that the heating and ion implanting steps may be performed without moving the sapphire member.

In some embodiments, the depth of implantation of the ions may be a function of the implantation energy, the size of the ion and the crystal plane into which the ions are implanted. The implantation energy may be a function of the systems, machines and methods used to implant the ions. An ion implantation device, such as illustrated in FIGS. 2A, 2B, 15 and 16, may operate at a particular energy level that is determinative, in part, of the depth of implantation of the ions. For example, the implantation device may operate at 80 keV, which may correlate to a first implantation depth, whereas a second implantation device may operate at 160 keV and may correlate to a second implantation depth which is deeper than the first implantation depth. Alternatively, the ion charge may also be selected to target a particular implantation depth, for example with singly-ionized (+1 charge) atoms of a particular type penetrating to a first target depth, and double or multiply-ionized (+2 charge or higher) atoms of the particular type penetrating to a second, lesser target implantation depth, as defined with respect to the implantation surface.

More generally, different ion beam, plasma, and ionic slurry-based ion implantation systems and methods may be used, either alone or in combination, in order to implant selected ions at different ion densities and implantation depths, based on parameters including, but not limited to, ion type (atomic number and atomic mass), charge (ionization level), implantation energy, and angle of incidence. The different implantation depths and ion types and densities generally create different compressive or tensile stresses at different depths of the crystalline structure, and may be selected so as to be operable to prevent propagation of damage at different levels or depths in the structure, as defined with respect to the ion implantation surface.

Figure 17:
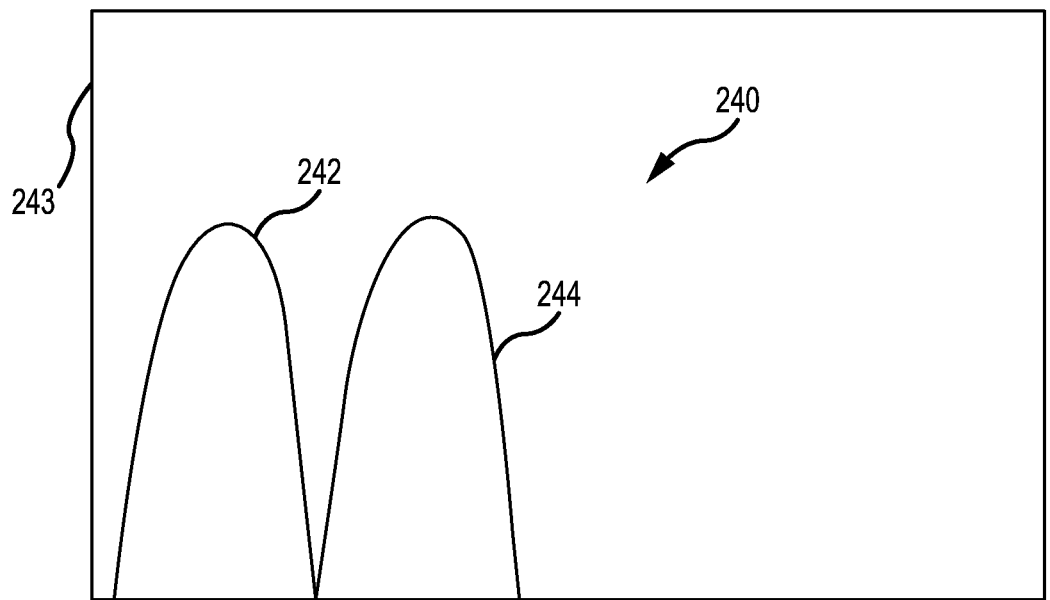
FIG. 17 illustrates an implantation curve showing the compressive stress at different depths of a crystalline structure due to ion implantation. The horizontal axis represents the depth in the crystalline structure and the vertical axis represents the stress level.

Turning to FIG. 17, an implantation curve 240 is illustrated which shows the compressive stress at different depths of a crystalline structure due to ion implantation. The horizontal axis 241 represents depth in the crystalline structure and the vertical axis 243 represents (e.g., compressive) stress. For example, a first stress peak 242 may be located at a first depth and a second stress peak 244 may be located at a second depth, different from the first depth. Thus, one, two or more distinct depths may be subject to the same or different compressive stresses, based on the selected ion implantation systems and methods, in order to prevent propagation of cracks in the crystalline structure.

Thus, the ions may be implanted with a concentration gradient, such that the ion concentration varies as a function of depth in the sapphire material, as defined in a substantially transverse or orthogonal (perpendicular) sense with respect to the implantation surface. Alternatively, ions may be implanted with a concentration gradient across the implantation surface, so that the ion concentration varies in a lateral direction along the surface, for example with different selected ion concentrations and/or implantation depths along the peripheral edge, as compared to the center portion or region, e.g., as described above with respect to FIG. 1.

The different stress peaks and depths may be selected or targeted based on common damage profiles. For example, a first stress peak may be placed approximately at a depth at which superficial damage commonly occurs. For example, the first peak 242 may be approximately centered at a depth of about 20 nm or less, with respect to the ion implantation surface. The second peak 244 may be located at depths that target damage deeper than that of a superficial nature, for example at a depth greater than approximately 20 nm.

As may be appreciated, ion implantation at different depths may be performed by one or more implanters or implantation systems. For example, a first implanter may operate at energy levels that implant ions at a deeper level than a second implanter that may operate at lower energy levels, or vice-versa. For example, a first implanter may operate at approximately 160 keV and a second implanter may operate at approximate 80 keV. Different ion beam, plasma immersion, and ionic slurry implantation systems and methods may also be utilized, as described above.

Further, in some embodiments, a single implanter may be configured to operate at multiple different energy levels or using different methods, in order to achieve the desired implantation profile. The energy level of the implanter may also be configured to switch between different operating energy levels in subsequent ion implantation steps. Further, the implanter may be configured to continuously implant ions as it transitions between different energy levels. Thus, ions may be implanted in or at one or more substantially discrete levels or depths within the crystalline structure, or at other than generally discrete levels, for example in a substantially continuous range of depths in the crystalline structure.

Figure 18:
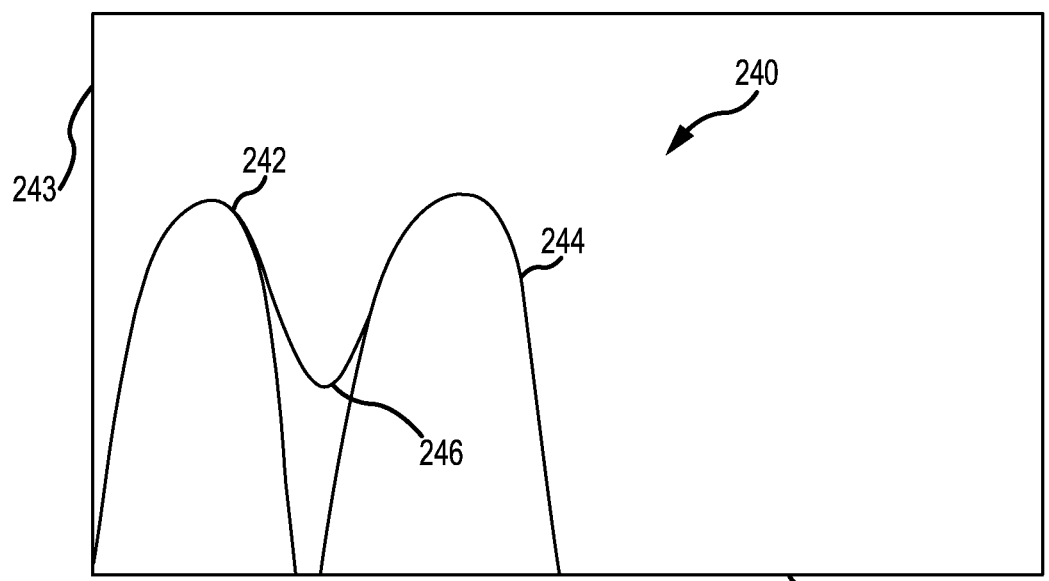
FIG. 18 illustrates the implantation curve of FIG. 17 with a smoothing region between two peaks.

FIG. 18 illustrates the implantation curve 240 with profile smoothing. Specifically, ions may be implanted at depths 246 in between the two peaks 242 and 244. The smoothing may help strengthen layers of the structure in between the targeted depths. The profile smoothing may occur as a result of the continuous implantation of the implanter as it transitions between different targeted energy levels. Additionally, or alternatively, profile smoothing may occur due to diffusion of the ions, for example during a diffusive heating step or annealing step. Moreover, smoothing may occur as a result of an overlap of ion implantation depths for two or more discrete implantation steps using different energy levels. That is, each step of implantation may include ions that do not implant at the precise target depth, thereby resulting in an implantation curve that may overlap with ion implantations intended for a different target depth.

Figure 19:
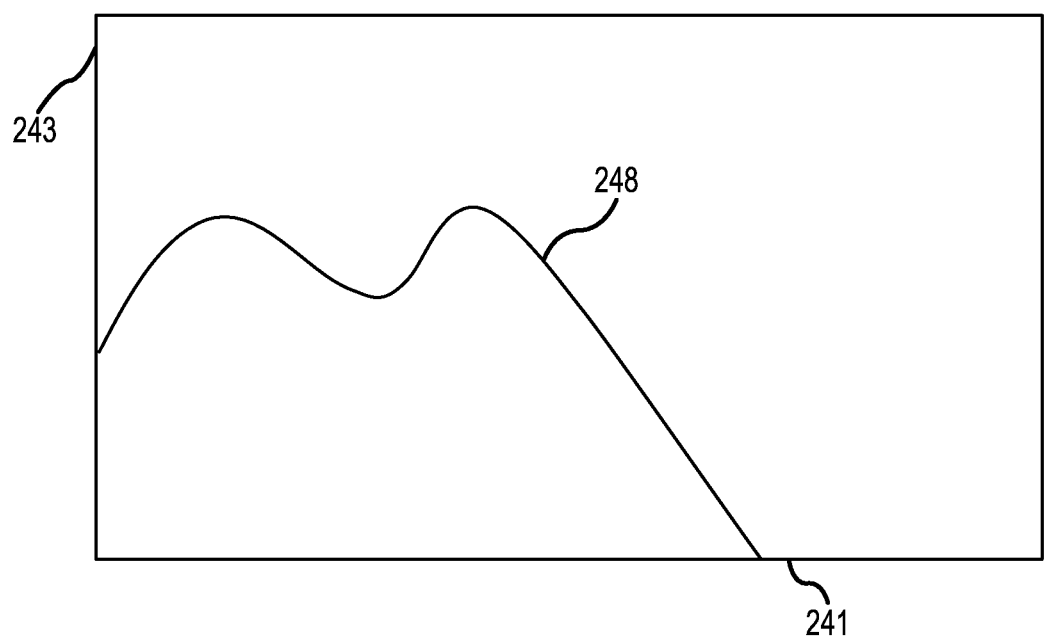
FIG. 19 illustrates an alternate implantation or net stress curve.

FIG. 19 illustrates an implantation curve 248 that may represent a net stress curve that results from the curve smoothing. As illustrated, the implantation curve 248 includes increased compressive stress at two peaks, which may represent target depths. However, there is compressive stress that extends from the surface (e.g., the origin on the horizontal axis) to beyond the deeper of the two peaks (e.g., beyond the second target depth).

It should be appreciated that the net stress curve may be customized based on desired strength characteristics for the structure. That is, the specific target depths may be selected for increased compressive stress to provide a desired protection against specific types of damage. Additionally, it should be appreciated that more or fewer than two depths may be targeted for the ion implantation. Moreover, the depths may be varied based on using different ions or elements to control the depth of implantation rather than the implantation energy, or some combination of energy level, implantation method, and/or ion/element selection. Further, the implanted ion density may vary at the different depth levels. As such, a first depth may include a first ion having a first concentration and a second depth may include a second ion having a second concentration different from, or the same as, the concentration of the first ion at the first depth.

Further still, in some embodiments, there may be some combination of ions at a particular depth level to achieve a desired effect. For example, titanium ions and argon ions may be implanted at the same or approximately same level. The desired effect may include a desired colorization and/or strengthening due to the implanted ions. In some embodiments, a particular depth level may be selected for strengthening and another level may be targeted to give a particular colorization.

In some embodiments, the depth levels of ion implantation may vary based on which surface of the crystalline structure is being implanted. For example, a top surface of the structure may have different ion implantation depths than those of the sidewalls of the structure. Additionally, a top surface may have different ion implantation depths from that of a bottom or sidewall surface, and/or different ion concentrations and so on. Different ions/elements or combinations thereof may also be implanted in different surfaces of the structure.

In some cases, the bombardment of ions into the crystalline structure (or other ion implantation process) may cause displacement of the atoms that make up the structure. That is, as ions are implanted into the structure, e.g., to either strengthen or add color to the structure, aluminum or oxygen atoms may be displaced from the crystal lattice. It is believed that the displacement may be generally more prevalent at the surface layers of the structure. In some cases, either aluminum or oxygen atoms may also have a higher rate of displacement, relative to the other atom. For example, more oxygen may be displaced than aluminum.

As may be appreciated, displacement may change the chemical makeup of the structure. To preserve the integrity of the structure, oxygen and/or aluminum atoms may be provided to replace displaced atoms. For example, if oxygen atoms are displaced at a higher rate than aluminum, oxygen atoms or ions may be bombarded onto the surface of the structure. In some embodiments, both oxygen and aluminum (or other selected atoms or ions) may be bombarded onto the surface, in the same or different atom bombardment or implantation steps, for example via an ion beam process, or utilizing a plasma immersion or ionic slurry process, or a combination of such processes, as described above, or via another atomic or ionic bombardment process.

Figure 20:
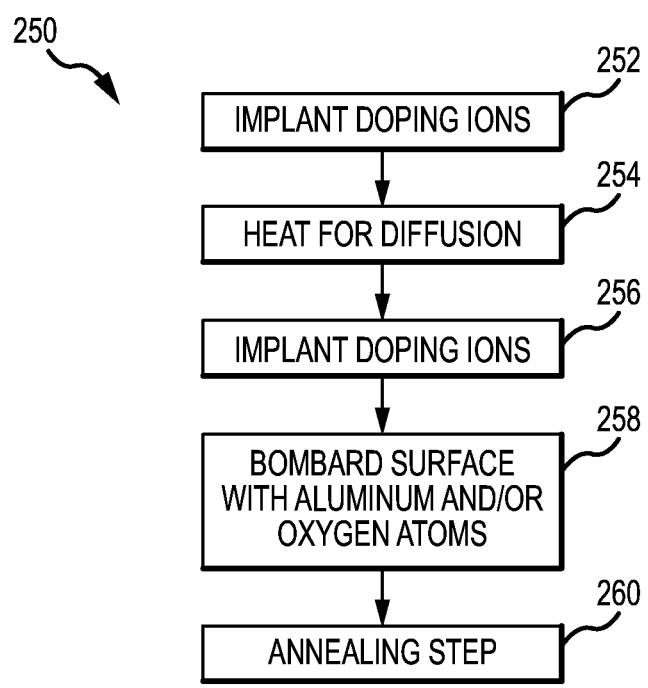
FIG. 20 is a flowchart illustrating an ion implantation process that includes an atom bombardment step to replace displaced atoms of the crystalline structure.

FIG. 20 is a flow chart illustrating an example process 250 that include the atom bombardment step. Initially, doping ions may be implanted (Block 252) in accordance with the techniques discussed above. A heating diffusion step (Block 254) may be performed to help the ions to diffuse into different layers of the structure. A second ion implantation step (or additional implantation steps) may then be performed (Block 256). The second ion implantation step may be performed with a different implantation energy, with a different concentration level, a different ion, or at a different temperature, or with the same operational parameters as the first implantation.

After the ion implantation steps, the surface may be bombarded with aluminum and/or oxygen atoms (Block 258). This step may be performed at a higher or lower temperature from that of the implantation steps. Additionally, one or more annealing steps 260 may be performed (Block 260). The annealing steps may help restore the crystalline structure (e.g., achieve a proper or desired relationship/ratio of aluminum atoms to oxygen atoms).

The various techniques described herein have numerous different applications. In particular, in consumer electronic devices, there may be applications related to and including, but not limited to, device cover glasses, windows, and other structures within the devices. One such exemplary use is for a camera window or cover glass component, or a selected surface or portion thereof.

Figure 21:
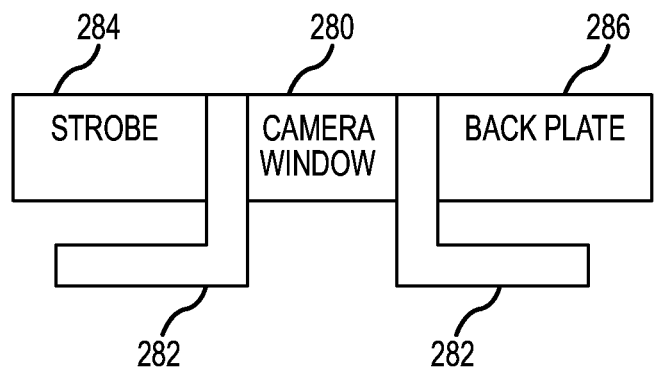
FIG. 21 illustrates a camera window with trim to prevent cross talk.
Figure 22:
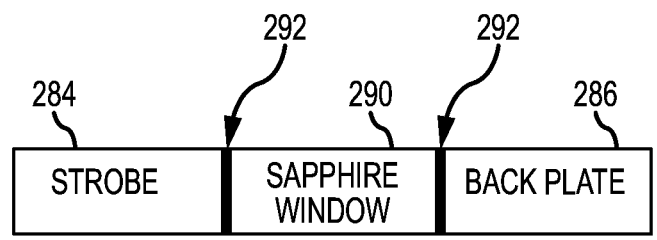
FIG. 22 illustrates a sapphire window with colored edges to prevent cross talk.

FIG. 21 illustrates a camera window 280. One either side (or surrounding) the camera window is a trim element 282 which is provided to prevent cross-talk from a strobe element 284 (e.g., a flash) and/or other light source, such as a display that may be positioned within a housing relative to the camera window and back plate 286. Turning to FIG. 22, in accordance with the present techniques, a sapphire window 290 may replace or be utilized for the camera window, and may have its edges 292 colored to effectively prevent cross talk from the strobe 284 and other sources, for example by ion implantation with selected ions of sufficient density to render one or more edges 292 substantially opaque. As such, the (e.g., separate or discrete) trim element 282 may be eliminated. This may provide several advantages such as reduced z-stack dimensions (e.g., possibly thinner devices), as well as stronger windows for the camera.

In processing the sapphire window component, top and bottom surfaces may also be implanted with different ions and/or concentrations relative to the edges so that the top and bottom surfaces have limited or substantially no effect on the optics of the window, as compared to a component without ion implanted surfaces. That is, while the edges may be implanted with ions to be substantially opaque or prevent light passage, the top and bottom surfaces may be implanted with ions in concentrations that will substantially maintain the transparency of the sapphire material.

Although the foregoing discussion has presented specific embodiments, persons skilled in the art will recognize that changes may be made in form and detail without departing from the spirit and scope of the disclosure. For example, the processing steps may be performed in another order, or in different combinations. Further, the different ion implantation steps may include different charges (e.g., single charged and double charged ions) as well as different implantation methods and energy levels. As such, the implantation depths may be selected based on multiple different parameters and their combinations. Accordingly, the specific embodiments described herein should be understood as examples and not limiting the scope of the disclosure.

The foregoing merely illustrates the principles of the invention. Various modifications and alterations to the described embodiments will be apparent to those skilled in the art, in view of the teachings herein. It will thus be appreciated that those having skill in the art will be able to devise numerous systems, arrangements and methods which, although not explicitly shown or described herein, embody the principles of the disclosure and are thus within the spirit and scope of the present invention. From the above description and drawings, it will be understood by those of ordinary skill in the art that the particular embodiments shown and described are for purposes of illustration only, and references to details of particular embodiments are not intended to limit the scope of the present invention, as defined by the appended claims.

We claim:

1. A method comprising:
    orienting a surface of a sapphire sheet relative to an ion implantation device;
    directing a first group of ions at a perimeter region of the surface of the sapphire sheet, the first group of ions embedding under the surface at a first concentration to create a compressive stress in the sapphire surface;
    directing a second group of ions at a window region of the surface of the sapphire sheet at least partially surrounded by the perimeter region, the second group of ions embedding under the surface at a second concentration to create a compressive stress in the sapphire surface; wherein
    a concentration gradient is formed at a transition region between the perimeter and window regions.

2. The method of claim 1, wherein the first group of ions are directed at the surface to achieve an ion concentration of between $10^{13}$ and $10^{19}$ ions/cm$^2$.

3. The method of claim 1, wherein the perimeter region is formed around an entire perimeter of the sapphire sheet.

4. The method of claim 1, wherein:
    the surface is a first surface; and
    the method further comprises:
        reorienting the sapphire sheet; and
        directing a third group of ions at a second surface of the sapphire sheet, the ions embedding under the second surface to create a compressive stress in the second surface.

5. The method of claim 4, wherein the third group of ions embed under the second surface at a third concentration different from the first and second concentrations.

6. The method of claim 4, wherein the first, second, and third groups of are each selected to comprise one or more of nitrogen ions, argon ions, titanium ions, or iron ions.

7. The method of claim 6, wherein the first group of ions comprise +1 ions.

8. The method of claim 6, wherein the first group of ions comprise +2 ions.

9. The method of claim 1, wherein the first group of ions penetrate to and are embedded in a primary lattice layer of the sapphire sheet.

10. The method of claim 1, wherein the first group of ions penetrate to and are embedded in a second lattice layer of the sapphire sheet.

11. The method of claim 1 further comprising masking a portion of the surface to preclude ion implantation in the masked portion of the sapphire surface.

12. A method comprising:
    selecting a first ion implantation concentration for a first portion of a surface of a sapphire sheet;
    directing ions at the first portion of the surface of the sapphire sheet at the first ion implantation concentration, the ions embedding under the first portion to create a compressive stress in the first portion;
    selecting a second ion implantation concentration for a second portion of the surface of the sapphire sheet, the second ion implantation concentration having a distinct energy or emitted ion concentration from the first ion implantation; and
    directing ions at the second portion of the surface of the sapphire sheet at the second ion implantation concentration, the ions embedding under the second portion to create a compressive stress in the second portion; wherein the second portion of the surface of the sapphire sheet at least partially surrounds the first portion of the surface of the sapphire sheet and a concentration gradient is formed between the first portion and the second portion.

13. The method of claim 12, wherein directing the ions at the first portion of the sapphire sheet at the first ion implantation concentration further comprises embedding the ions under the first portion at a first depth.

14. The method of claim 13, wherein directing the ions at the second portion of the sapphire sheet at the second ion implantation concentration further comprises embedding the ions under the second portion at a second depth.

15. The method of claim 14, wherein the second depth is different from the first depth.

16. The method of claim 12, wherein the type of ions embedded under the first portion are distinct from the ions embedded under the second portion.

17. The method of claim 12, wherein the first portion comprises a top surface of the sapphire sheet.

18. The method of claim 17, wherein the second portion comprises at least one edge surface.

* * * * *